US012641792B2

(12) United States Patent
Ko

(10) Patent No.: US 12,641,792 B2
(45) Date of Patent: May 26, 2026

(54) METHOD FOR MANUFACTURING THREE-DIMENSIONAL MEMORY DEVICE

(71) Applicant: MACRONIX International Co., Ltd., Hsinchu (TW)

(72) Inventor: Zong-Jie Ko, Kaohsiung City (TW)

(73) Assignee: MACRONIX International Co., Ltd., Hsinchu (TW)

( * ) Notice: Subject to any disclaimer, the term of this patent is extended or adjusted under 35 U.S.C. 154(b) by 471 days.

(21) Appl. No.: 18/470,420

(22) Filed: Sep. 20, 2023

(65) Prior Publication Data

US 2025/0098163 A1 Mar. 20, 2025

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ....... H10B 43/27; H10B 41/27; H10D 30/693
See application file for complete search history.

(56) References Cited

U.S. PATENT DOCUMENTS

2013/0207178 A1* 8/2013 Lee ........................ H10B 43/27
257/324
2019/0131126 A1 5/2019 Ko et al.

FOREIGN PATENT DOCUMENTS

TW 201500572 1/2015

OTHER PUBLICATIONS

"Office Action of Taiwan Counterpart Application", issued on Jun. 18, 2024, pp. 1-4.

* cited by examiner

*Primary Examiner* — Mohammad A Rahman
(74) *Attorney, Agent, or Firm* — J.C. PATENTS

(57) ABSTRACT

The present disclosure relates to a method for manufacturing a 3D memory device, and particularly, to a method for manufacturing high capacity and high performance 3D NAND flash memory device. The method includes: alternately stacking sacrificial layers and insulating layers; forming a channel through hole through the sacrificial layers and the insulating layers; lining the channel through hole with an initial blocking layer; and performing an oxidation treatment, for turning the initial blocking layer to a blocking oxide layer. A gas source for the oxidation treatment includes a reaction gas having hydrogen and oxygen, and includes an ionization enhancement gas formed by a first type ionization enhancement gas, a second type ionization enhancement gas or a combination thereof. The first type ionization enhancement gas includes at least one in a group consist of tritium, ozone and $H_2O$. The second type ionization enhancement gas includes at least one inert gas.

19 Claims, 10 Drawing Sheets

100g

110

R

P_OX

122

116

114b
112b
114a
112a

METHOD FOR MANUFACTURING THREE-DIMENSIONAL MEMORY DEVICE

BACKGROUND

Technical Field

The present disclosure relates to a method for manufacturing a three-dimensional (3D) memory device, and particularly, to a method for manufacturing a 3D NAND flash memory device.

Description of Related Art

Along with developments of manufacturing process and circuit design, dimension of each memory cell in memory device has been significantly reduced. However, as technological bottlenecks have gradually emerged, it becomes more difficult to further increase storage density if memory cells are arranged in the same plane. As a breakthrough, a 3D memory architecture with stacking memory cells has been proposed. Since more memory cells can be included in a given area, 3D memory device has greatly improved storage density and storage capacity, and can be manufactured with lowered cost per byte.

3D NAND flash memory device is a comprehensively used 3D memory device. In general, 3D NAND flash memory device includes word lines stacked over a substrate, channel layers penetrating through the word lines and charge storage layers wrapping the channel structures to separate the channel layers from the word lines. Each charge storage layer is a multilayer structure. When aspect ratio (height-to-width ratio) of the channel structures is very large, thickness uniformity of a material layer in each charge storage layer (e.g., a blocking layer) may be unacceptable. Specifically, the blocking layers may have a rather large thickness at a first height close to top ends of the channel structures, while having a rather small thickness at a second thickness close to bottom ends of the channel structures. As a consequence, the blocking layers may have unsatisfactory charge blocking ability at the second height, and vertical leakage paths may be established. In other words, performance of 3D NAND flash memory is compromised.

SUMMARY

A method for manufacturing a 3D memory device is provided, for effectively preventing the vertical leakage.

According to some embodiments, a method for manufacturing a 3D memory device comprises: alternately forming sacrificial layers and insulating layers on a substrate; forming a channel through hole penetrating through the sacrificial layers and the insulating layers; forming an initial blocking layer covering surfaces of the channel through hole; and performing an oxidation treatment to oxidize the initial blocking layer, so as to turn the initial blocking layer into a blocking oxide layer, wherein a gas source for the oxidation treatment comprises a reaction gas and an ionization enhancement gas, the reaction gas comprises hydrogen and oxygen, the ionization enhancement gas comprises a first type ionization enhancement gas and, a second type ionization enhancement gas or a combination of the first type ionization enhancement gas and the second type ionization enhancement gas, the first type ionization enhancement gas comprises at least one in a group consists of tritium, ozone and water, and the second type ionization enhancement gas comprises at least one inert gas.

According to other embodiments, a method for manufacturing a 3D memory device comprises: alternately forming first sacrificial layers and first insulating layers on a substrate; forming a first channel through hole penetrating through the first sacrificial layers and the first insulating layers; alternatively forming second sacrificial layers and second insulating layers on the first sacrificial layers and the first insulating layers; forming a second channel through hole penetrating through the second sacrificial layers and the second insulating layers to be communicated with the first channel through hole; forming an initial blocking layer covering surfaces of the first channel through hole and the second channel through hole; and performing an oxidation treatment to oxidize the initial blocking layer, so as to turn the initial blocking layer into a blocking oxide layer, wherein a gas source for the oxidation treatment comprises a reaction gas and an ionization enhancement gas, the reaction gas comprises hydrogen and oxygen, the ionization enhancement gas comprises a first type ionization enhancement gas and, a second type ionization enhancement gas or a combination of the first type ionization enhancement gas and the second type ionization enhancement gas, the first type ionization enhancement gas comprises at least one in a group consists of tritium, ozone and water, and the second type ionization enhancement gas comprises at least one inert gas.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A through FIG. 1G are cross-sectional views illustrating a series of intermediate structures 100a, 100b, 100c, 100d, 100e, 100f, 100g during manufacturing of a 3D NAND flash memory device, according to some embodiments of the present disclosure.

Figure 1A:
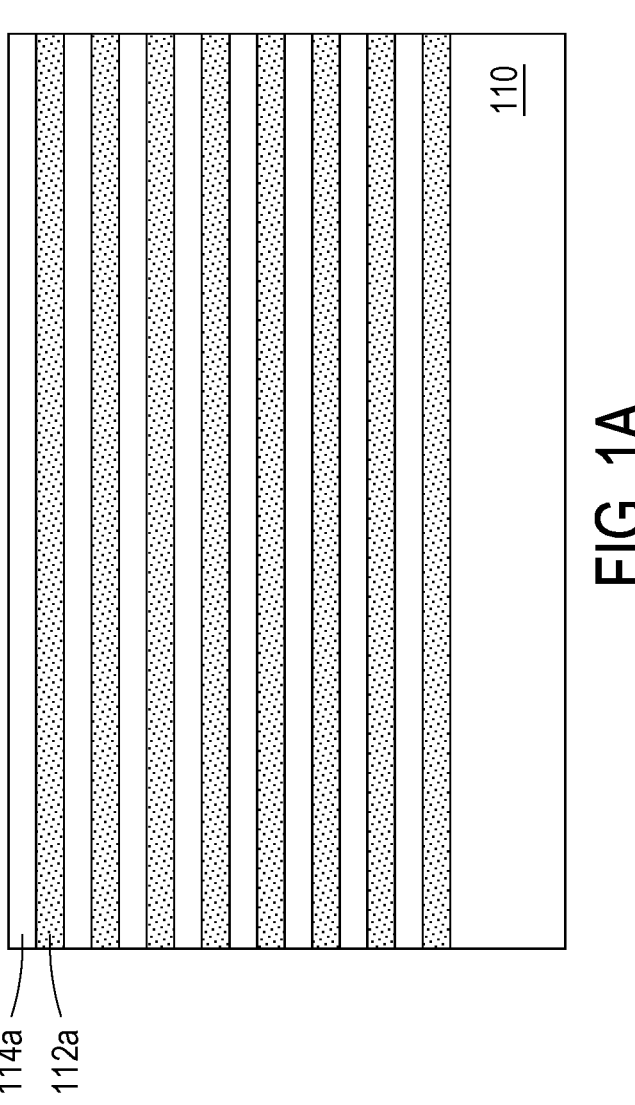
FIG. 1A through FIG. 1G are cross-sectional views illustrating a series of intermediate structures during manufacturing of a 3D NAND flash memory device, according to some embodiments of the present disclosure.

As shown by the intermediate structure 100a in FIG. 1A, at an initial step, sacrificial layers 112a and insulating layers 114a are alternately formed on a substrate 110. In following steps, the sacrificial layers 112a will be patterned and replaced with lower gate layers functioned as lower word lines. On the other hand, the insulating layers 114a will be patterned and remained as lower inter-gate insulating layers, for providing electrical isolation between the lower gate layers. The sacrificial layers 112a and the insulating layers 114a have sufficient etching selectivity with respect to each other. As an example, the sacrificial layers 112a may be formed of silicon nitride, while the insulating layers 114a may be formed of silicon oxide.

Figure 1B:
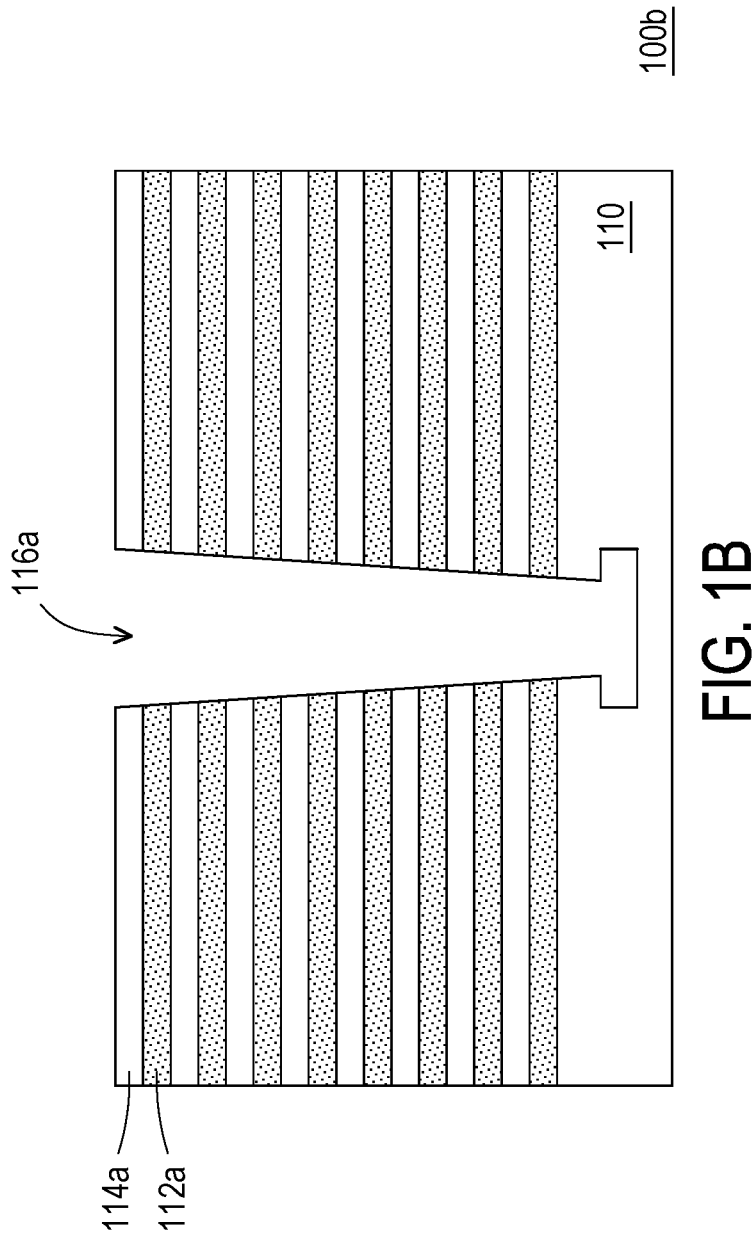

Afterwards, as shown by the intermediate structure 100b in FIG. 1B, lower channel through holes 116a (only a single one is shown) are formed into the substrate 110 through the sacrificial layers 112a and the insulating layers 114a. In following steps, charge storage layers and channel layers will cover surfaces of the lower channel through holes 116a, and central regions of the lower channel through holes 116a will be filled out by insulating plugs. Although only a single one is depicted, the lower channel through holes 116a may be arranged as an array. A combination of a lithography process and an etching process may be used for forming the lower channel through holes 116a. Owing to etching characteristics, the lower channel through holes 116a may taper toward their bottom ends. In some embodiments, each lower channel through hole 116a tapers downwardly to reach top of its lateral extending portion. In these embodiments, the lateral extending portion of each lower channel through hole 116a laterally extends from the tapered portion of the lower channel through hole 116a, and is greater in width as compared to a narrow end of the tapered portion.

Figure 1C:
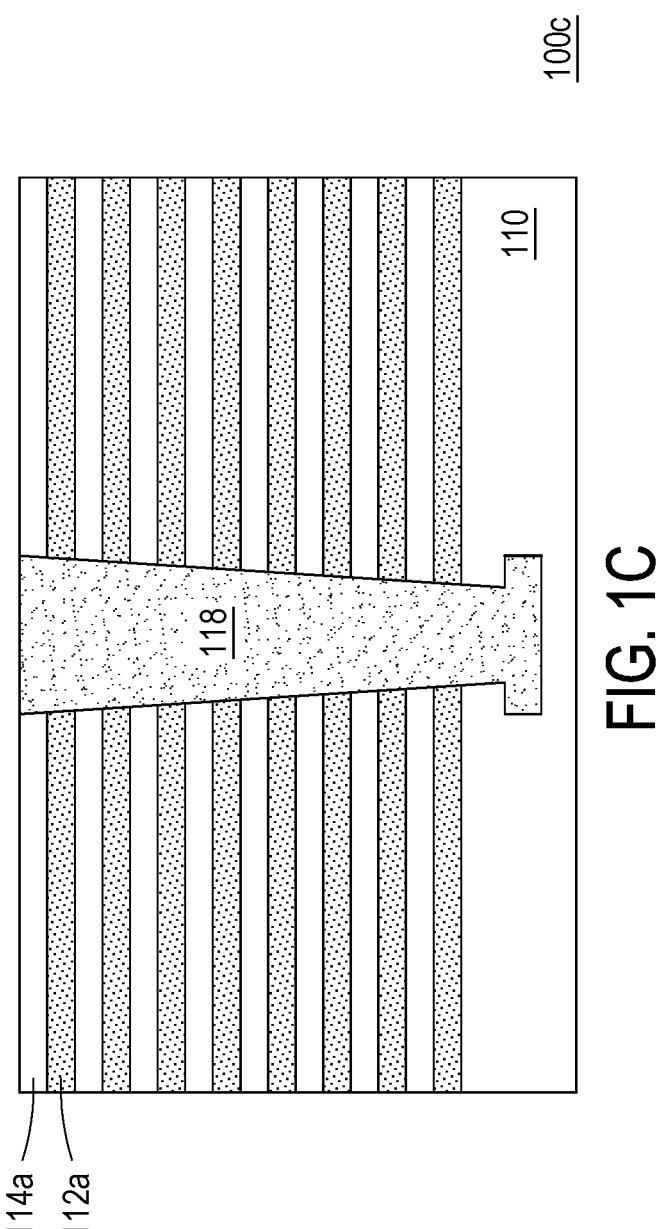

As shown by the intermediate structure 100c in FIG. 1C, the lower channel through holes 116a may be temporarily filled out by sacrificial structures 118. In following steps, additional sacrificial layers and additional insulating layers will be stacked on the current structure. By disposing the sacrificial structures 118, a planar deposition surface can be provided for the additional sacrificial layers and the additional insulating layers. In addition, in a further step, upper channel through holes will be formed through the additional sacrificial layers and the additional insulating layers, and the sacrificial structures 118 will be removed to expose the lower channel through holes 116a. In some embodiments, the sacrificial structure 118 is formed of silicon nitride.

Figure 1D:
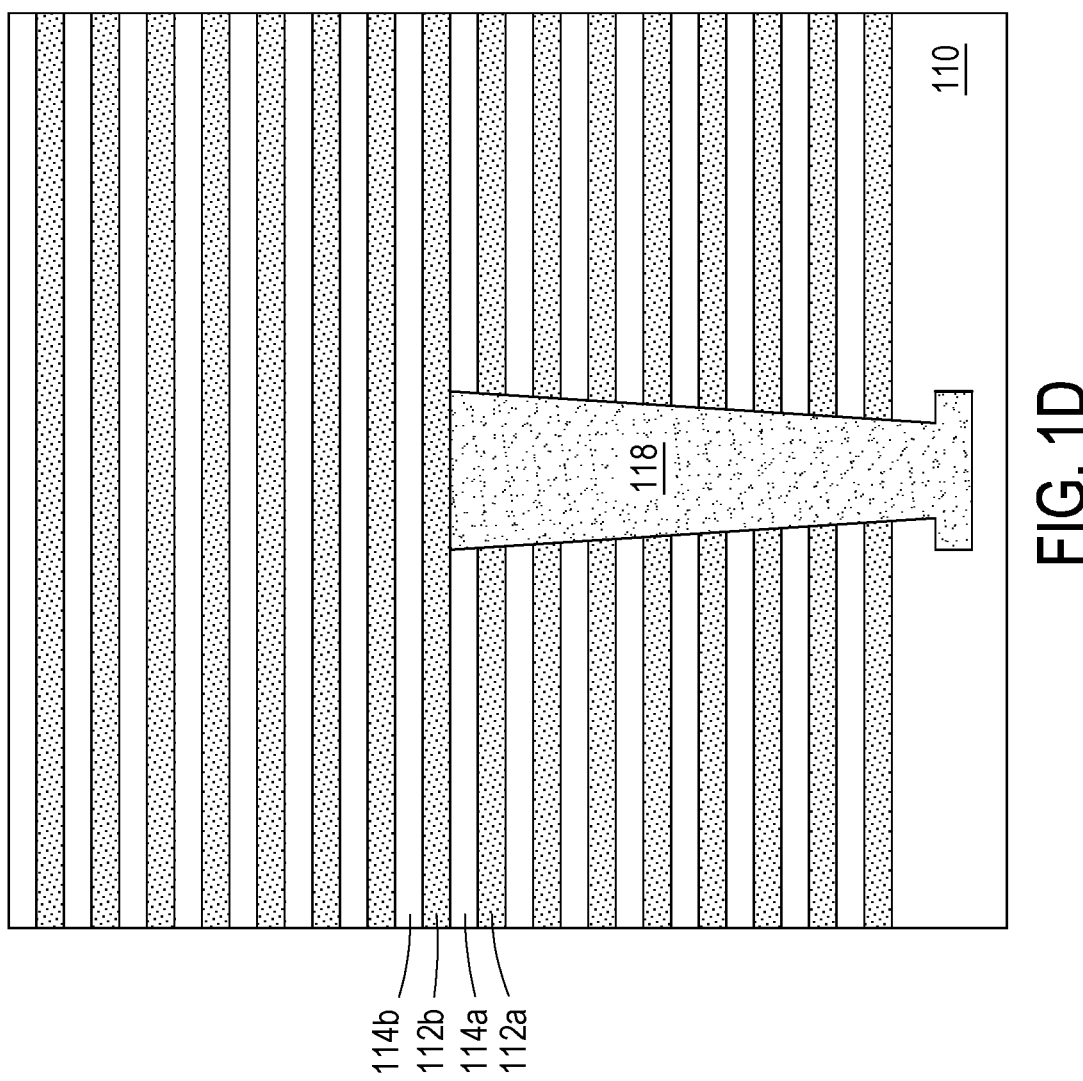

Next, as shown by the intermediate structure 100d in FIG. 1D, sacrificial layers 112b (i.e., the aforesaid additional sacrificial layers) and insulating layers 114b (i.e., the aforesaid additional insulating layers) are alternately formed on the stack of the sacrificial layers 112a and the insulating layers 114a as well as the sacrificial structures 118. In following steps, the sacrificial layers 112b may be patterned and replaced with upper gate layers functioned as upper word lines. On the other hand, the insulating layers 114b will be patterned and remained as upper inter-gate insulating layers, for providing electrical isolation between the upper gate layers. Unless designed otherwise, the sacrificial layers 112b are identical with the sacrificial layers 112a in terms of material and thickness, and the insulating layers 114b are identical with the insulating layers 114a in terms of material and thickness.

Figure 1E:
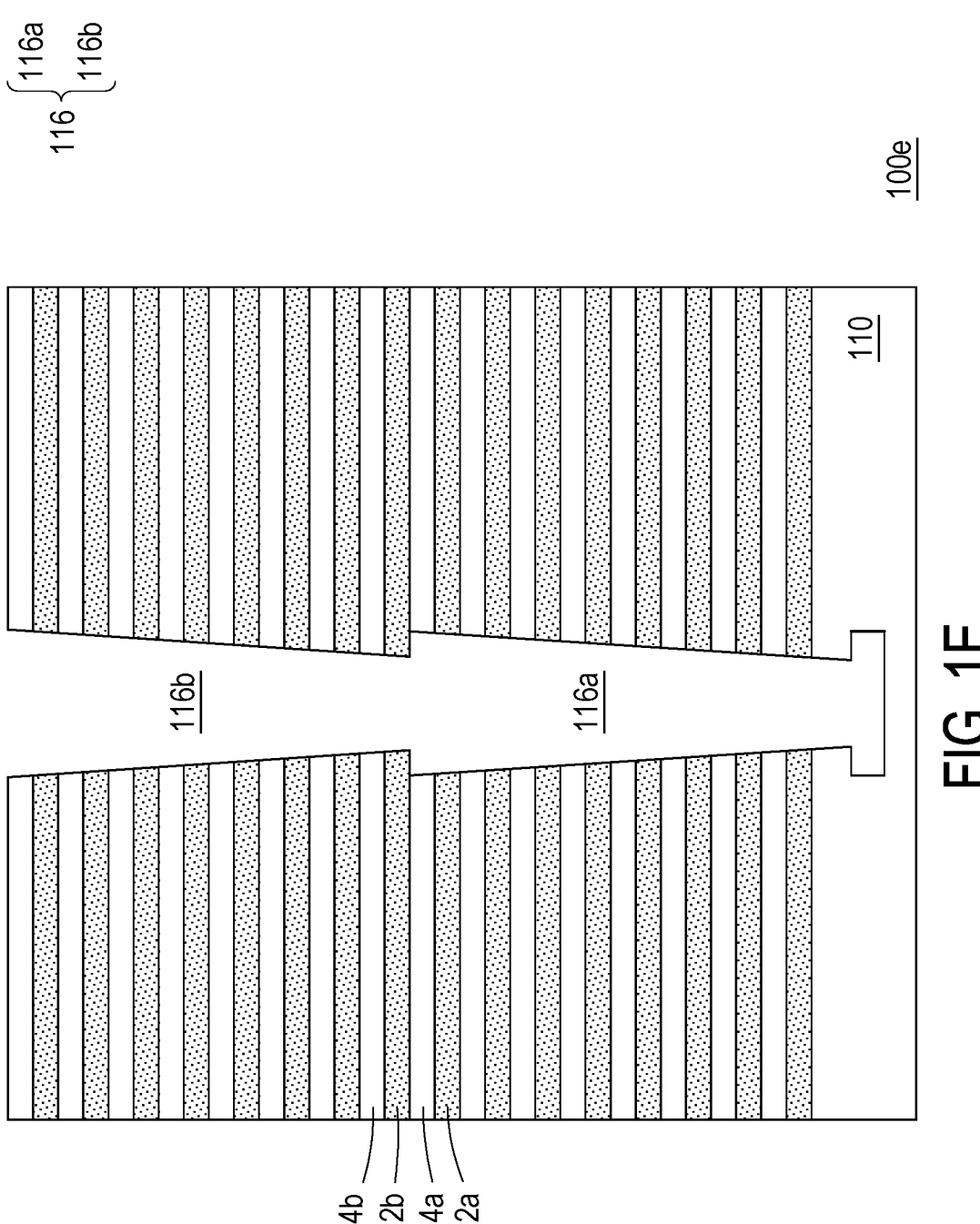

As shown by the intermediate structure 100e in FIG. 1E, then upper channel through holes 116b extending through the sacrificial layers 112b and the insulating layers 114b to reach top ends of the sacrificial structures 118 are formed, and the exposed sacrificial structures 118 are removed. As a result, the lower channel through holes 116a are currently exposed, and are communicated with the upper channel through holes 116b. The communicated lower and upper channel through holes 116a, 116b combine to form channel through holes 116 with high aspect ratio (depth-to-width ratio). It should be appreciated that, an amount of the upper channel through holes 116b should be equal to an amount of the lower channel through holes 116a, and positions of the upper channel through holes 116b should be in accordance with positions of the lower channel through holes 116a. In following steps, the charge storage layers, the channel layers and the insulating plugs will be filled in the channel through holes 116. Consequently, the charge storage layers and the channel layers not only cover surfaces of the lower channel through holes 116a, but also cover surfaces of the upper channel through holes 116b. Similarly, the insulating plugs not only fill out central portions of the lower channel through holes 116a, but also fill out central portions of the upper channel through holes 116b.

A lithography process and at least one etching process may be involved in forming the upper channel through holes 116b and removing the sacrificial structures 118. The lithography process may define the positions of the upper channel through holes 116b. On the other hand, a first etching process may be performed to etch through the sacrificial layers 112b and the insulating layers 114b, for forming the upper channel through holes 116b and exposing the sacrificial structures 118. In addition, a following second etching process may be performed to remove the sacrificial structures 118. Owing to etching characteristics, the upper channel through holes 116b may taper downwardly from their top ends to top ends of the lower channel through holes 116a (i.e., wide ends of the tapered portions of the lower channel through holes 116a). As bottom ends of the upper channel through holes 116b (i.e., narrow ends of the upper channel through holes 116b) may be narrower than the top ends of the lower channel through holes 116a (i.e., the wide ends of the lower channel through holes 116a), sidewalls of the channel through holes 116 may have lateral recesses at where the upper channel through holes 116b and the lower channel through holes 116a are connected.

Figure 1F:
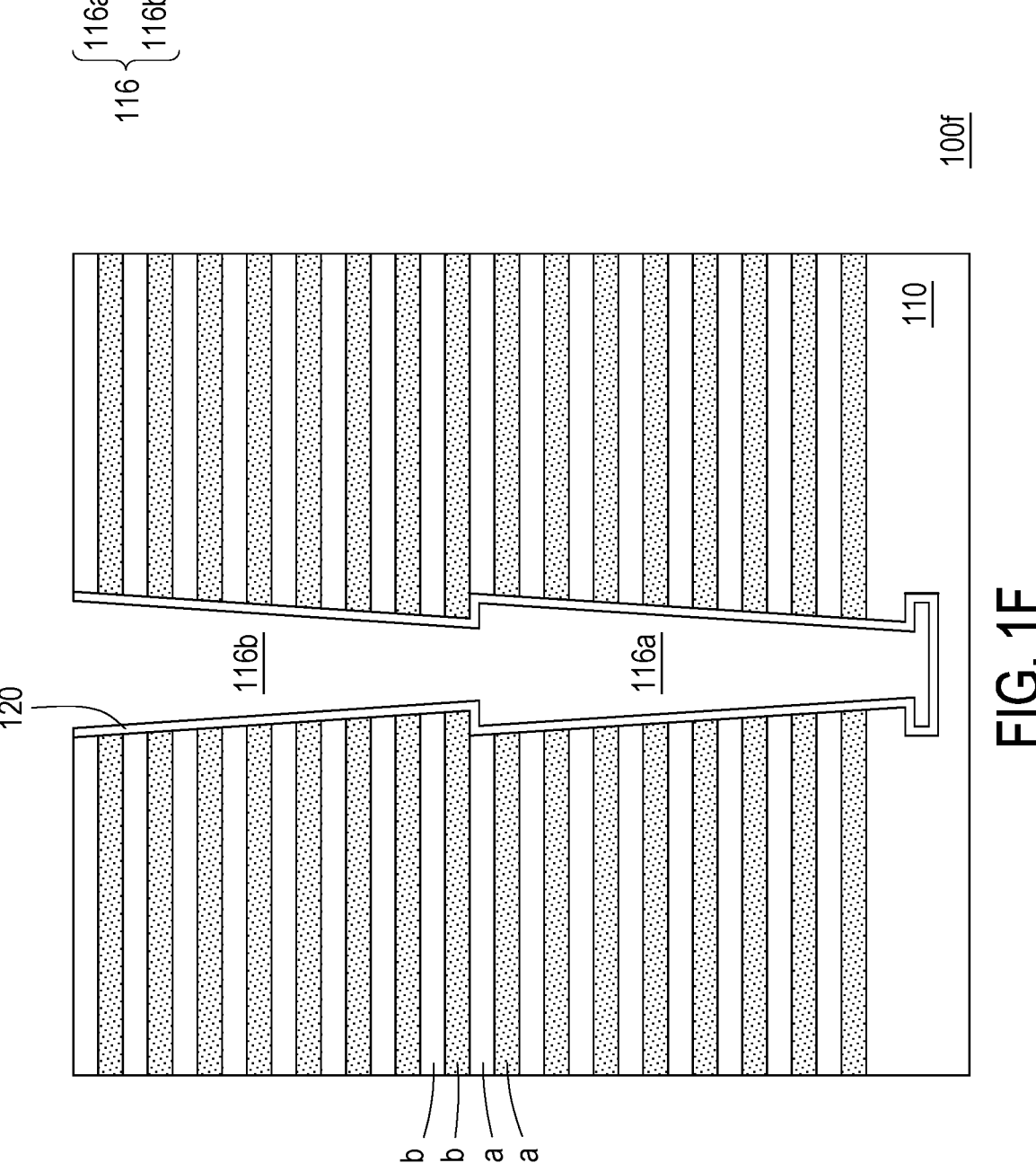

As shown by the intermediate structure 100f in FIG. 1F, initial blocking layers 120 are formed on the sidewalls of the channel through holes 116, respectively. The initial blocking layers 120 will be subjected to a following oxidation treatment, and become blocking oxide layers of the charge storage layers. Currently, the initial blocking layers 120 may conformally cover the surfaces of the channel through holes 116. In some embodiments, the initial blocking layers 120 are formed of silicon nitride, and a conformal deposition process may be used for forming the initial blocking layers 120. As an example, the conformal deposition process may be an atomic layer deposition (ALD) process or a chemical vapor deposition (CVD) process.

Figure 1G:

As shown in FIG. 1G, after formation of the initial blocking layers 120, the initial blocking layers 120 are subjected to an oxidation treatment $P_{OX}$. The initial blocking layers 120 are oxidized to form blocking oxide layers 122, as indicated by the intermediate structure 100g. During the oxidation treatment $P_{OX}$, oxygen radicals and/or hydrogen radicals react with the initial blocking layers 120. As a result, some atoms in the initial blocking layers 120 are replaced with oxygen atoms, thus the initial blocking layers 120 are oxidized to form the blocking oxide layers 122. In the example that the initial blocking layers 120 are formed of silicon nitride, nitrogen atoms in the initial blocking layers 120 may be replaced by oxygen atoms, thus the initial blocking layers 120 are turned into the blocking oxide layers 122 formed of silicon oxide or nitrogen doped silicon oxide.

The oxidation treatment $P_{OX}$ may be implemented by a CVD process. For instance, the oxidation treatment $P_{OX}$ may be implemented by a thermal CVD process or a plasma enhanced CVD process. A combination of a reaction gas including oxygen and hydrogen and an ionization enhancement gas is used as a gas source for the oxidation treatment $P_{OX}$. During the oxidation treatment $P_{OX}$, the reaction gas and the ionization enhancement gas are ionized to form radicals R, which include hydrogen radicals, oxygen radicals, hydroxyl radicals and more. Among the radicals R, oxygen radicals and/or hydroxyl radicals react with the initial blocking layer 120, to replace some atoms in the initial blocking layers 120 with oxygen, and turn the initial blocking layers 120 into the blocking oxide layers 122. However, as compared to hydrogen radicals, oxygen radicals and hydroxyl radicals have shorter lifetime, thus it is more difficult for oxygen radicals and hydroxyl radicals to enter bottom regions of the channel through holes 116. Participation of the ionization enhancement gas allows more oxygen radicals and hydroxyl radicals can be generated. Therefore, a greater amount of oxygen radicals and hydroxyl radicals can enter the bottom regions of the channel through holes 116, thus bottom portions of the initial blocking layers 120 can be fully oxidized.

If the gas source of the oxidation treatment $P_{OX}$ only includes the reaction gas (i.e., oxygen and hydrogen), less oxygen radicals and hydroxyl radicals can be generated. As a consequence, the limited oxygen radicals and hydroxyl radicals may barely enter the bottom regions of the channel through holes 116, but accumulate at top regions of the channel through holes 116. Accordingly, oxidation of the bottom portions of the initial blocking layers 120 would be incomplete, as compared to oxidation of top portions of the initial blocking layers 120. Therefore, the resulted blocking oxide layers 122 may have a rather small thickness at the bottom regions of the channel through holes 116, while having a rather large thickness at the top regions of the channel through holes 116. Such non-uniformity in thickness may be a reason that the resulted blocking oxide layers 122 cannot effectively block charges at the bottom regions of the channel through holes 116, and may result in formation of vertical leakage paths. In other words, as the gas source of the oxidation treatment $P_{OX}$ further incorporates the ionization enhancement gas, promising thickness uniformity of the blocking oxide layers 122 can be ensured, and the eventually formed 3D NAND flash memory can be avoided from issues caused by the vertical leakage.

The ionization enhancement gas includes a first type ionization enhancement gas, a second type ionization enhancement gas or a combination of the first type ionization enhancement gas and the second type ionization enhancement gas. The first type ionization enhancement gas may include at least one in a group consists of tritium ($^3H$), ozone ($O_3$) and water ($H_2O$). As compared to oxygen and hydrogen, the first type ionization enhancement gas is easier to be ionized, so as to (directly or indirectly) produce more oxygen radicals and/or hydroxyl radicals during thermal ionization or plasma ionization. Specifically, as compared to oxygen, ozone is a stronger oxidant, and capable of generating more oxygen radicals. Similarly, as compared to oxygen and hydrogen, water is capable of producing more oxygen radicals and hydroxyl radicals. On the other hand, tritium may combine with oxygen during decay, for producing more hydroxyl radicals. In some embodiments, tritium, ozone or water can be solely used as the first type ionization enhancement gas. In other embodiments, at least two of the group consists of tritium, ozone and water are included in the first type ionization enhancement gas. In further embodiments, the first type ionization enhancement gas contains a combination of tritium, ozone and water.

On the other hand, the second type ionization enhancement gas may include at least one in a group consists of inert gases such as helium (He), neon (Ne), argon (Ar), krypton (Kr), xenon (Xe), radon (Rn). Ionized inert gas may strike the reaction gas (a combination of oxygen and hydrogen), to produce more hydrogen radicals, oxygen radicals and hydroxyl radicals. Further, inert gas would barely react with the initial blocking layers 120, thus is unlikely to be remained in the resulted blocking oxide layers 122. Therefore, characteristics of the blocking oxide layers 122 would not be compromised. In some embodiments, a single inert gas is used as the second type ionization enhancement gas. In alternative embodiments, the second type ionization enhancement gas includes a combination of at least two different inert gases.

As a first example, the ionization enhancement gas only includes the first type ionization enhancement gas, which includes a single one in the group consists of tritium, ozone and water. As a second example, the ionization enhancement gas only includes the first type ionization enhancement gas, which includes two in the group consists of tritium, ozone and water. As a third example, the ionization enhancement gas only includes the first type ionization enhancement gas, which includes everyone in the group consists of tritium, ozone and water. As a fourth example, the ionization enhancement gas only includes the second type ionization enhancement gas. As a fifth example, the ionization enhancement gas includes both of the first type ionization enhancement gas and the second type ionization enhancement gas, and the first type ionization enhancement gas only includes one in the group consists of tritium, ozone and water. As a sixth example, the ionization enhancement gas includes both of the first type ionization enhancement gas and the second type ionization enhancement gas, and the first type ionization enhancement gas includes two in the group consists of tritium, ozone and water. As a seventh example, the ionization enhancement gas includes both of the first type ionization enhancement gas and the second type ionization enhancement gas, and the first type ionization enhancement gas includes everyone in the group consists of tritium, ozone and water.

Figure 2A:
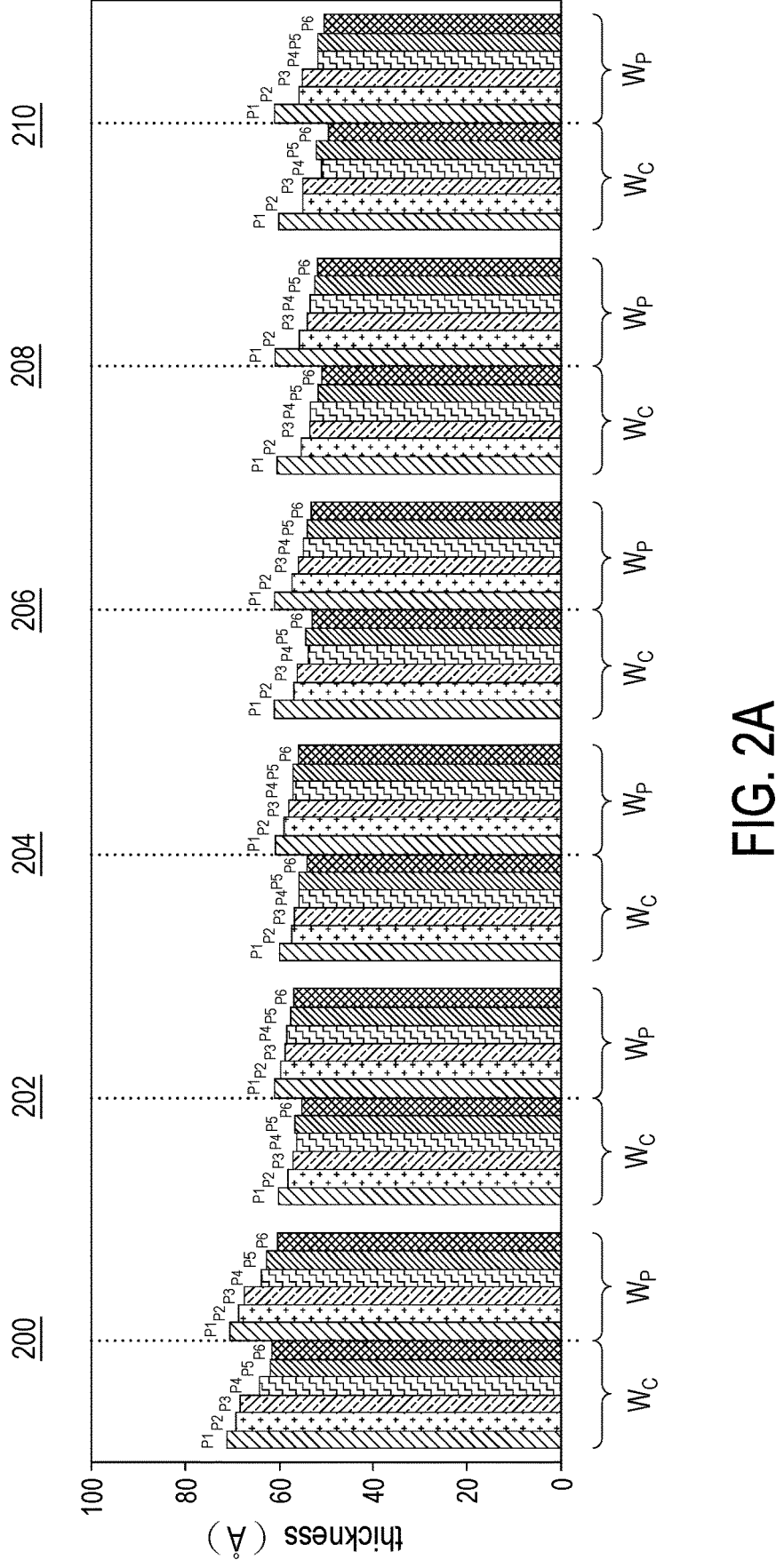
FIG. 2A shows bar graphs indicating thickness uniformity of the blocking oxide layers with respect to varying content of the ionization enhancement gas.

FIG. 2A shows bar graphs indicating thickness uniformity of the blocking oxide layers 122 with respect to varying content of the ionization enhancement gas.

Referring to FIG. 2A, bar graphs 200, 202, 204, 206, 208, 210 correspond to conditions that the gas source used for the oxidation treatment $P_{OX}$ has fixed total flow rate (4 slm) but varies in composition. Specifically, the bar graph 200 shows thickness distribution of the blocking oxide layers 122 at different locations and different heights when the gas source for the oxidation treatment $P_{OX}$ only includes the reaction gas. The bar graph 202 shows thickness distribution of the blocking oxide layers 122 at different locations and different heights when the gas source for the oxidation treatment $P_{OX}$ includes the ionization enhancement gas by 10%. The bar graph 204 shows thickness distribution of the blocking oxide layers 122 at different locations and different heights when the gas source for the oxidation treatment $P_{OX}$ includes the ionization enhancement gas by 20%. The bar graph 206 shows thickness distribution of the blocking oxide layers 122 at different locations and different heights when the gas source for the oxidation treatment $P_{OX}$ includes the ionization enhancement gas by 33%. The bar graph 208 shows thickness distribution of the blocking oxide layers 122 at different locations and different heights when the gas source for the oxidation treatment $P_{OX}$ includes the ionization enhancement gas by 50%. The bar graph 210 shows thickness distribution of the blocking oxide layers 122 at different locations and different heights when the gas source for the oxidation treatment $P_{OX}$ includes the ionization enhancement gas by 66%.

To be more specific, these bar graphs present thicknesses at different heights of one of the blocking oxide layers 122 within a wafer central region $W_C$, and thicknesses at different heights of another one of the blocking oxide layers 122 within a wafer peripheral region $W_P$. Locations P1, P2, P3, P4, P5, P6 indicate first to sixths heights (from lowest to highest) in the corresponding channel through hole 116. As described, as having shorter lifetime, it is harder for oxygen radicals and hydroxyl radicals to reach the bottom regions of the channel through holes 116. Therefore, no matter how much the ionization enhancement gas is included in the gas source for the oxidation treatment $P_{OX}$, the resulted blocking oxide layers 122 are thicker at a greater height, and thinner at a lower height. Nevertheless, when the ionization enhancement gas is included in the gas source, thickness variation at different heights of the resulted blocking oxide layers 122 can be significantly reduced.

Specifically, when the gas source for the oxidation treatment $P_{OX}$ only includes the reaction gas (corresponding to the bar graph 200), thickness variation at different heights of the resulted blocking oxide layers 122 is very large, no matter in the wafer central region $W_C$ or in the wafer peripheral region $W_P$. On the other hand, when the gas source for the oxidation treatment $P_{OX}$ includes both of the reaction gas and the ionization enhancement gas (corresponding to the bar graphs 202, 204, 206, 208, 210), thickness variation at different heights of the resulted blocking oxide layers 122 are significantly reduced, in both of the wafer central region $W_C$ and the wafer peripheral region $W_P$. Particularly, when the gas source includes the ionization enhancement gas by 10% to 20% (corresponding to the bar graphs 202, 204), the resulted blocking oxide layers 122 have the most improved thickness uniformity (about 90% to 92%). It should be noted that the thickness uniformity described in the present disclosure referred to as a ratio (in percentage) of a smallest thickness of a blocking oxide layer 122 with respect to a greatest thickness the blocking oxide layer 122.

Figure 2B:
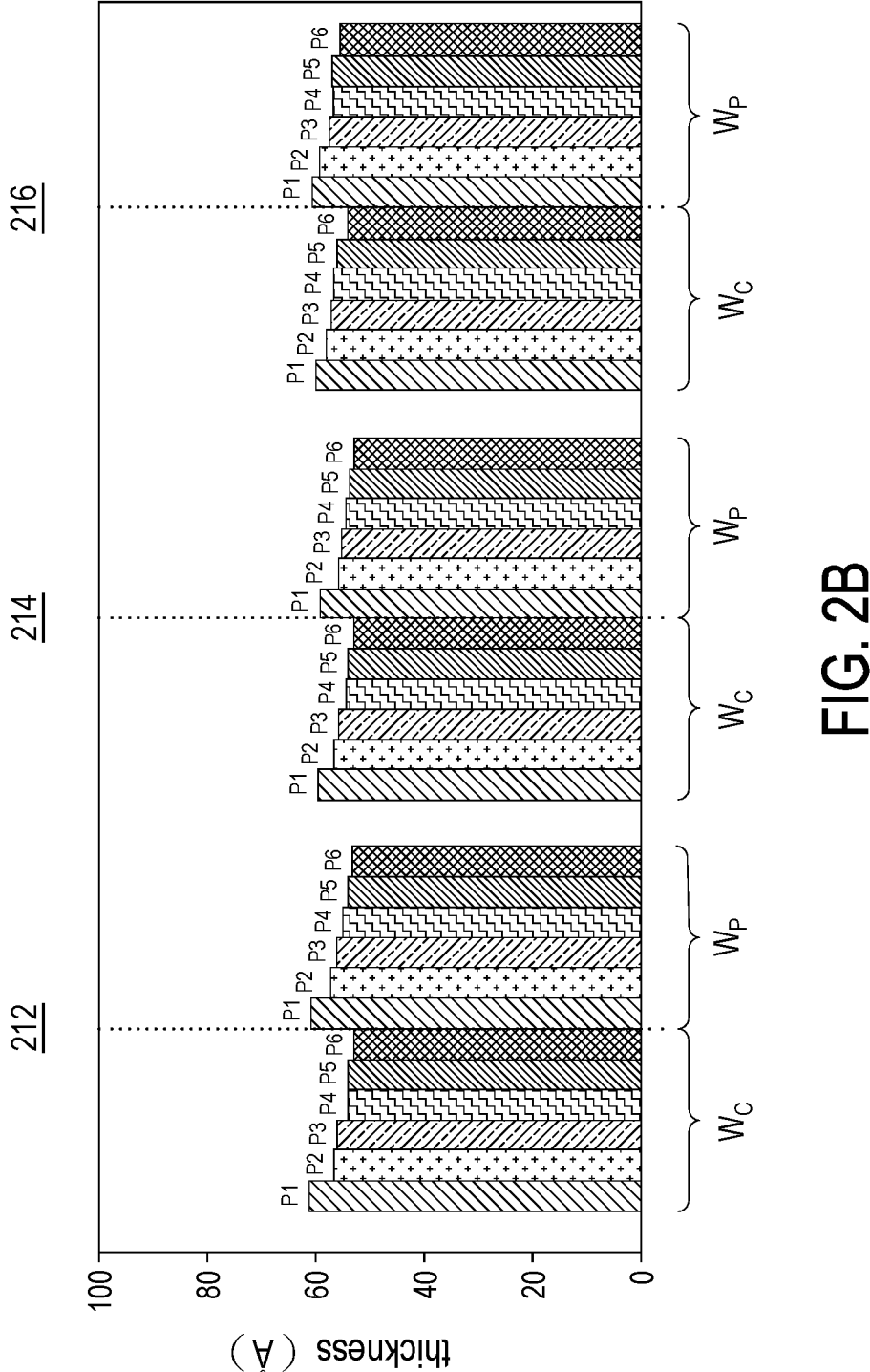
FIG. 2B shows bar graphs indicating thickness uniformity of the blocking oxide layers with respect to varying total flow rate of the gas source.

FIG. 2B shows bar graphs indicating thickness uniformity of the blocking oxide layers 122 with respect to varying total flow rate of the gas source.

Referring to FIG. 2B, bar graphs 212, 214, 216 correspond to conditions that the gas source for the oxidation treatment $P_{OX}$ has fixed composition (the ionization enhancement gas is included by 33%) but varies in total flow rate. Specifically, the bar graph 212 shows thickness distribution of the blocking oxide layers 122 at the locations P1-P6 when the gas source for the oxidation treatment $P_{OX}$ includes the ionization enhancement gas by 33% and is provided with a total flow rate of 4 slm. The bar graph 214 shows thickness distribution of the blocking oxide layers 122 at the locations P1-P6 when the gas source for the oxidation treatment $P_{OX}$ includes the ionization enhancement gas by 33% and is provided with a total flow rate of 15 slm. The bar graph 216 shows thickness distribution of the blocking oxide layers 122 at the locations P1-P6 when the gas source for the oxidation treatment $P_{OX}$ includes the ionization enhancement gas by 33% and is provided with a total flow rate of 20 slm.

As indicated by the bar graphs 212, 214, 216, the blocking oxide layers 122 can be resulted with promising thickness uniformity when the gas source including the ionization enhancement gas by fixed content (33%) is provide with different total flow rates. Particularly, the blocking oxide layers 122 can be resulted with the most improved thickness uniformity (about 89% to 92%) when the gas source is provided with a total flow rate of 15 slm to 20 slm (corresponding to the bar graphs 214, 216).

Figure 2C:
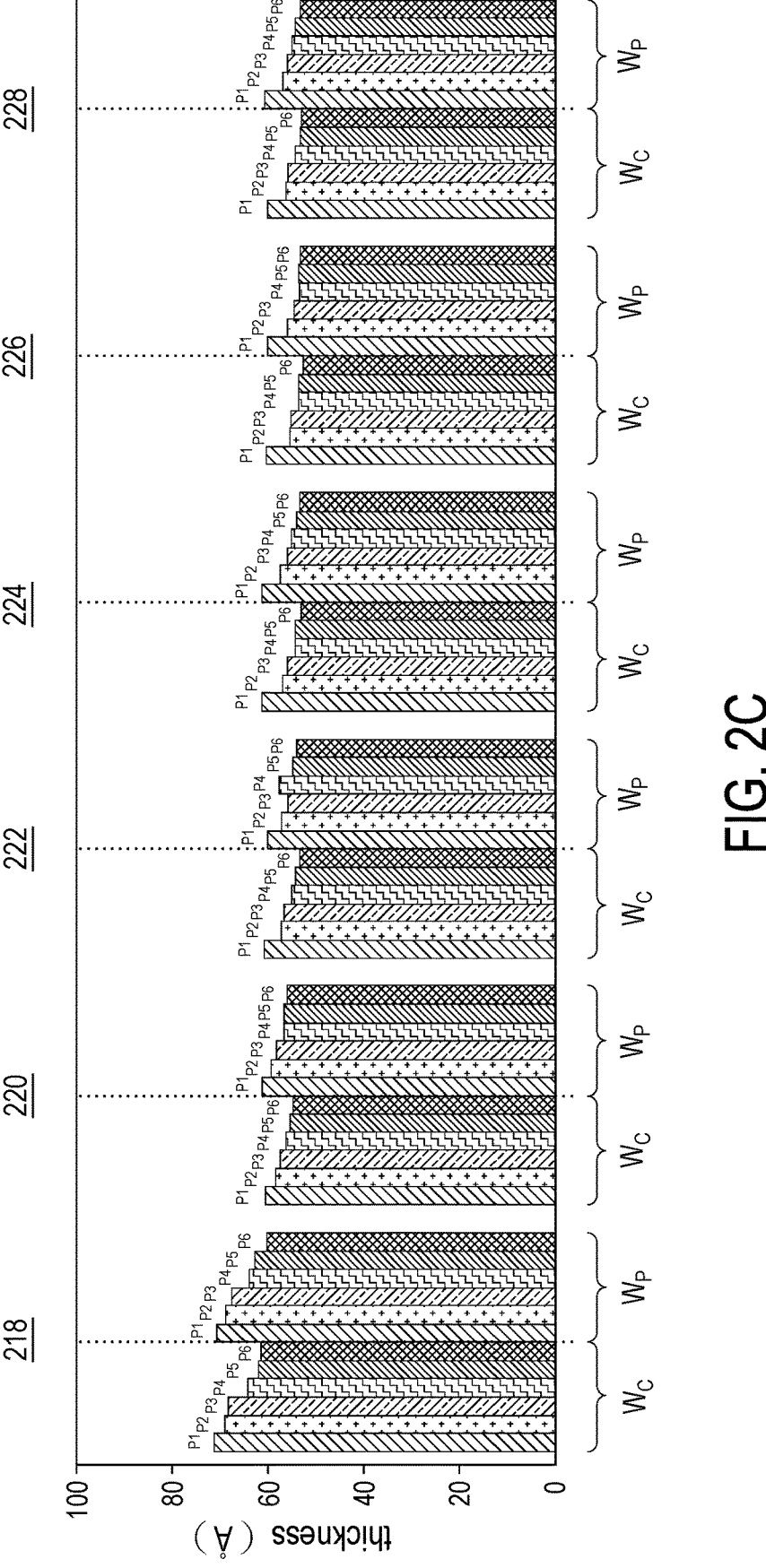
FIG. 2C shows bar graphs indicating thickness uniformity of the blocking oxide layers with respect to varying content of the ionization enhancement gas when flow rate of the reaction gas is fixed.

FIG. 2C shows bar graphs indicating thickness uniformity of the blocking oxide layers 122 with respect to varying content of the ionization enhancement gas when flow rate of the reaction gas is fixed.

Referring to FIG. 2C, bar graphs 218, 220, 222, 24, 226, 228 correspond to conditions that that the gas source for the oxidation treatment $P_{OX}$ includes the reaction gas by fixed flow rate but includes the ionization enhancement gas by different contents. Specifically, the bar graph 218 shows thickness distribution of the blocking oxide layers 122 at the locations P1-P6 when the gas source for the oxidation treatment $P_{OX}$ only includes the reaction gas provided with the fixed flow rate. The bar graph 220 shows thickness distribution of the blocking oxide layers 122 at the locations P1-P6 when the gas source for the oxidation treatment $P_{OX}$ includes the reaction gas provided by the fixed flow rate and includes the ionization enhancement gas by 10%. The bar graph 222 shows thickness distribution of the blocking oxide layers 122 at the locations P1-P6 when the gas source for the oxidation treatment $P_{OX}$ includes the reaction gas provided by the fixed flow rate and includes the ionization enhancement gas by 20%. The bar graph 224 shows thickness distribution of the blocking oxide layers 122 at the locations P1-P6 when the gas source for the oxidation treatment $P_{OX}$ includes the reaction gas provided by the fixed flow rate and includes the ionization enhancement gas by 33%. The bar graph 226 shows thickness distribution of the blocking oxide layers 122 at the locations P1-P6 when the gas source for the oxidation treatment $P_{OX}$ includes the reaction gas provided by the fixed flow rate and includes the ionization enhancement gas by 55%. The bar graph 228 shows thickness distribution of the blocking oxide layers 122 at the locations P1-P6 when the gas source for the oxidation treatment $P_{OX}$ includes the reaction gas provided by the fixed flow rate and includes the ionization enhancement gas by 66.7%.

When the gas source for the oxidation treatment $P_{OX}$ only includes the reaction gas provided by the fixed flow rate (corresponding to the bar graph 218), the resulted blocking oxide layers 122 exhibit large thickness variation at different heights, no matter in the wafer central region $W_C$ or in the wafer peripheral region $W_P$. On the other hand, when the gas source for the oxidation treatment $P_{OX}$ includes the reaction gas by the fixed flow rate and includes the ionization enhancement gas by different contents (corresponding to the bar graphs 220, 222, 224, 226, 228), the resulted blocking oxide layers 122 exhibit much improved thickness uniformity in both of the wafer central region $W_C$ and the wafer peripheral region $W_P$. Particularly, when the gas source includes the ionization enhancement gas by 10% (corresponding to the bar graph 220) to 20% (corresponding to the bar graph 222), the resulted blocking oxide layers 122 have the greatest thickness uniformity (about 88% to 90%).

As described, by further incorporating the ionization enhancement gas into the gas source for the oxidation treatment $P_{OX}$, the initial blocking layers 120 can be oxidized with improved uniformity, thus the blocking oxide layers 122 with great thickness uniformity can be resulted. Although not shown, in following steps, charge trapping layers (e.g., silicon nitride layers), tunneling layer (e.g., silicon oxide layers) and channel layers (e.g., polysilicon layers) will be formed on surfaces of the blocking oxide layers 122 in order. Thereafter, the channel through holes 116 may be filled out by insulating plugs. Afterwards, the sacrificial layers 112a are replaced with the lower gate layers functioned as the lower word lines. Meanwhile, the sacrificial layers 112b are replaced with the upper gate layers functioned as the upper word lines. All the structures filled in each channel through hole 116 can be referred to as a channel structure. Memory cells are respectively defined at an interface between one of the word lines and a contacted one of the channel structures. That is, the memory cells are stacked along the channel structures. As compared to arranging memory cells in the same plane, stacking the memory cells can result in greater capacity per unit area, and can equivalently lower manufacturing cost for each memory cell.

According to the embodiments described with reference to FIG. 1A through FIG. 1G, formation of the channel through holes 116 is split in two parts (one for forming a lower half of each channel through hole 116 and the other for forming an upper half of each channel through hole 116). In other embodiments, channel through holes with greater depth-to-width ratio can be formed by three or more parts. Alternatively, channel through holes with less depth-to-width ratio may be formed without splitting into multiple parts. The present disclosure is not limited to depth-to-width ratio and/or formation method of the channel through holes. Those skilled in the art may adjust dimensions and formation method of the channel through holes according to product specifications.

As above, the present disclosure relates to a method for manufacturing a memory device, and particularly, to a method for manufacturing a 3D NAND flash memory device. The 3D NAND flash memory device includes stacks of memory cells. As compared to a planar memory device, the 3D NAND flash memory device has greater capacity. Each memory cell in the 3D NAND flash memory device is defined by a word line as well as a charge storage layer and a channel layer in contact with the word line. The charge storage layers respectively include a blocking oxide layer. A method for forming the blocking oxide layers includes forming initial blocking layers on surfaces of channel through holes, and performing an oxidation treatment to oxidize the initial blocking layers, for turning the initial blocking layers into the blocking oxide layers. A gas source for the oxidation treatment includes a reaction gas containing oxygen and hydrogen, and further includes an ionization enhancement gas. As a result, more oxygen radicals and hydroxyl radicals can be generated. Accordingly, more oxygen radicals and hydroxyl radicals can enter bottom regions of the channel through holes, thus bottom portions of the initial blocking layers can be fully oxidized. Therefore, thickness variation at different heights of the blocking oxide layers can be effectively reduced. Owing to great thickness uniformity, the blocking oxide layers can be well functioned for blocking charges at various heights, and the 3D NAND flash memory device can be effectively avoided from vertical leakage, so as to be operated with improved performance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for manufacturing a 3D memory device, comprising:

alternately forming sacrificial layers and insulating layers on a substrate;

forming a channel through hole penetrating through the sacrificial layers and the insulating layers;

forming an initial blocking layer covering surfaces of the channel through hole; and performing an oxidation treatment to oxidize the initial blocking layer, so as to turn the initial blocking layer into a blocking oxide layer, wherein a gas source for the oxidation treatment comprises a reaction gas and an ionization enhancement gas, the reaction gas comprises hydrogen and oxygen, the ionization enhancement gas comprises a first type ionization enhancement gas and, a second type ionization enhancement gas or a combination of the first type ionization enhancement gas and the second type ionization enhancement gas, the first type ionization enhancement gas comprises at least one in a group consists of tritium, ozone and water, and the second type ionization enhancement gas comprises at least one inert gas.

2. The method for manufacturing the 3D memory device according to claim 1, wherein the ionization enhancement gas is included in the gas source by 10% to 20%.

3. The method for manufacturing the 3D memory device according to claim 1, wherein the gas source is provided with a total flow rate ranging from 15 slm to 20 slm.

4. The method for manufacturing the 3D memory device according to claim 1, wherein a thickness uniformity of the blocking oxide layer ranges from 88% to 92%, and the thickness uniformity is defined as a percentage of a smallest thickness of the blocking oxide layer with respect to a greatest thickness of the blocking oxide layer.

5. The method for manufacturing the 3D memory device according to claim 1, wherein the initial blocking layer is formed of silicon nitride, and nitrogen atoms in the initial blocking layer are replaced with oxygen atoms during the oxidation treatment.

6. The method for manufacturing the 3D memory device according to claim 1, wherein the oxidation treatment is implemented by a chemical vapor deposition process.

7. The method for manufacturing the 3D memory device according to claim 1, wherein the ionization enhancement gas only comprises the first type ionization enhancement gas, and the first type ionization enhancement gas only comprises a single one in the group consists of tritium, ozone and water.

8. The method for manufacturing the 3D memory device according to claim 1, wherein the ionization enhancement gas only comprises the first type ionization enhancement gas, and the first type ionization enhancement gas comprises two in the group consists of tritium, ozone and water.

9. The method for manufacturing the 3D memory device according to claim 1, wherein the ionization enhancement gas only comprises the first type ionization enhancement gas, and the first type ionization enhancement gas comprises everyone in the group consists of tritium, ozone and water.

10. The method for manufacturing the 3D memory device according to claim 1, wherein the ionization enhancement gas only comprises the second type ionization enhancement gas.

11. The method for manufacturing the 3D memory device according to claim 1, wherein the ionization enhancement gas comprises both of the first type ionization enhancement gas and the second type ionization enhancement gas, and the first type ionization enhancement gas only comprises a single one in the group consists of tritium, ozone and water.

12. The method for manufacturing the 3D memory device according to claim 1, wherein the ionization enhancement gas comprises both of the first type ionization enhancement gas and the second type ionization enhancement gas, and the first type ionization enhancement gas comprises two in the group consists of tritium, ozone and water.

13. The method for manufacturing the 3D memory device according to claim 1, wherein the ionization enhancement gas comprises both of the first type ionization enhancement gas and the second type ionization enhancement gas, and the first type ionization enhancement gas comprises everyone in the group consists of tritium, ozone and water.

14. A method for manufacturing a 3D memory device, comprising:

alternately forming first sacrificial layers and first insulating layers on a substrate;

forming a first channel through hole penetrating through the first sacrificial layers and the first insulating layers;

alternatively forming second sacrificial layers and second insulating layers on the first sacrificial layers and the first insulating layers;

forming a second channel through hole penetrating through the second sacrificial layers and the second insulating layers to be communicated with the first channel through hole;

forming an initial blocking layer covering surfaces of the first channel through hole and the second channel through hole; and performing an oxidation treatment to oxidize the initial blocking layer, so as to turn the initial blocking layer into a blocking oxide layer, wherein a gas source for the oxidation treatment comprises a reaction gas and an ionization enhancement gas, the reaction gas comprises hydrogen and oxygen, the ionization enhancement gas comprises a first type ionization enhancement gas and, a second type ionization enhancement gas or a combination of the first type ionization enhancement gas and the second type ionization enhancement gas, the first type ionization enhancement gas comprises at least one in a group consists of tritium, ozone and water, and the second type ionization enhancement gas comprises at least one inert gas.

15. The method for manufacturing the 3D memory device according to claim 14, further comprising:

filling the first channel through hole by a sacrificial structure before formation of the second sacrificial layers and the second insulating layers.

16. The method for manufacturing the 3D memory device according to claim 15, wherein the sacrificial structure is removed while forming the second channel through hole.

17. The method for forming the 3D memory device according to claim 14, further comprising:

sequentially forming a charge trapping layer, a tunneling layer and a channel layer covering the blocking oxide layer after performing the oxidation treatment; and filling out central regions of the first channel through hole and the second channel through hole by an insulating plug.

18. The method for forming the 3D memory device according to claim 17, further comprising:

replacing the first sacrificial layers by lower gate layers and replacing the second sacrificial layers by upper gate layers, after formation of the insulating plug.

19. The method for forming the 3D memory device according to claim 14, wherein the 3D memory device is a 3D NAND flash memory device.

* * * * *